US006978405B1

(12) United States Patent
Sellmair

(10) Patent No.: US 6,978,405 B1
(45) Date of Patent: Dec. 20, 2005

(54) MEMORY DEVICE WITH COMPARISON UNITS TO CHECK FUNCTIONALITY OF ADDRESSED MEMORY CELLS

(75) Inventor: Gerald Sellmair, Landshut (DE)

(73) Assignee: Infineon Technologies AG, Munich (DE)

( * ) Notice: Subject to any disclaimer, the term of this patent is extended or adjusted under 35 U.S.C. 154(b) by 636 days.

(21) Appl. No.: 09/711,866

(22) Filed: Nov. 13, 2000

(30) Foreign Application Priority Data

Nov. 11, 1999 (DE) .............................. 199 54 346

(51) Int. Cl.[7] .......................................... G11C 29/00
(52) U.S. Cl. ...................... 714/718; 714/719; 714/763
(58) Field of Search ................................ 714/755, 718, 714/29, 738, 763, 719; 365/200; 705/200; 234/760

(56) References Cited

U.S. PATENT DOCUMENTS

| | | | | |
|---|---|---|---|---|
| 4,499,556 A | * | 2/1985 | Halpern | ....................... 713/200 |
| 4,639,915 A | * | 1/1987 | Bosse | ......................... 714/711 |
| 5,007,026 A | | 4/1991 | Gaultier et al. | |
| 5,299,202 A | | 3/1994 | Vaillancourt | |
| 5,325,365 A | * | 6/1994 | Moore et al. | .................. 714/29 |
| 5,825,783 A | | 10/1998 | Momohara | |
| 6,202,180 B1 | * | 3/2001 | Nose | .......................... 714/718 |
| 6,314,031 B1 | * | 11/2001 | Sellmair et al. | ............ 365/200 |

FOREIGN PATENT DOCUMENTS

| | | | | |
|---|---|---|---|---|
| DE | 689 01 738 T2 | 9/1989 | ........... G11C 29/00 |
| DE | 197 45 678 A1 | 4/1999 | ........... H05K 7/14 |
| EP | 0 778 584 A1 | 6/1997 | ........... G11C 29/00 |
| JP | 03-157897 A | 7/1991 | ........... G11C 29/00 |
| JP | 06-164704 A | 6/1994 | ........... H01L 21/82 |
| JP | 11-086569 A | 3/1999 | ........... G11C 16/02 |

* cited by examiner

Primary Examiner—Guy J. Lamarre
(74) Attorney, Agent, or Firm—Laurence A. Greenberg; Werner H. Stemer; Ralph E. Locher

(57) ABSTRACT

The memory device contains comparison units with which it is possible to check whether an address applied to the memory device is associated with a memory cell which cannot be properly written to or read out or is located in a memory cell area containing memory cells which cannot be properly written to or read out. During the testing of the memory device, the comparison units can be placed into a state which differs from the state of the comparison units during the normal operation of the memory device.

27 Claims, 3 Drawing Sheets

MEMORY DEVICE WITH COMPARISON UNITS TO CHECK FUNCTIONALITY OF ADDRESSED MEMORY CELLS

BACKGROUND OF THE INVENTION

Field of the Invention

The present invention relates to a memory device with a multiplicity of memory cells for storing data. The device comprises comparison units by means of which it is possible to check whether an address applied to the memory device is associated with a memory cell that cannot be properly written to or read out or that is located in a memory cell area containing memory cells which cannot be properly written to or read out.

A memory device of the generic type is diagrammatically illustrated in FIG. 5. It will be understood that the diagram of FIG. 5 only shows those components of the memory device which are presently of particular interest.

The memory device is designated by the reference symbol S in FIG. 5.

In the example considered, the memory device S is configured for storing 16 Mbits of data, that is to say it has at least 16 M memory cells. The memory cells are thereby distributed over 16 equally large memory blocks SB1 to SB16 which, therefore, are designed for storing 1 Mbit of data in each case. The memory blocks SB1 to SB16, in turn, are distributed over four equally large memory banks SBankA, SBankB, SBankC and SBankD in the example considered.

The memory cells of each memory block of the exemplary device are arranged in a memory cell matrix comprising 512 rows and 2048 columns, that is to say they can be addressed via 512 word lines and 2048 bit lines. The measures to be undertaken in detail for writing to or reading out selected memory cells are generally known to those of skill in the art and they will, therefore, not be explained in greater detail.

The memory cells to be written to or read out in each case are determined by an address applied to the memory device, more precisely to its terminals Al to An; the data which are to be written to the memory cells concerned or which are to be read out from the memory cells concerned are applied to or, respectively, provided for retrieval at terminals D1 to Dm of the memory device.

The memory device considered in the example has more than the 16 M memory cells which are required for storing 16 Mbits of data. The additional cells are provided such that memory cells or memory cell areas which cannot be properly written to or read out can be replaced by other memory cells or memory cell areas.

The memory cells or memory cell areas which cannot be properly written to or read out, more precisely the addresses associated with these memory cells or memory cell areas, are determined during a test of the memory device and registered, for example by using so-called fuses F in the memory device.

In normal operation of the memory device, the addresses applied to it via the terminals A1 to An of the memory device are compared with the addresses registered in the memory device of the memory cells or memory cell areas which cannot be properly written to or read out, by means of comparison units VE. If such a comparison results in a correspondence, this is signaled to a selection device AE which ensures that data to be written to the memory device are not written to the memory cells which are designated by the address applied to the memory device but to (spare) memory cells associated with the memory cells which cannot be used, or that data to be read out of the memory device are not read out of the memory cells which are designated by the address applied to the memory device but out of (spare) memory cells associated with the memory cells which cannot be used.

Memory devices in which not all memory cells can be properly written to and read out can be used like completely faultless memory devices in the manner described; the user of the memory device does not notice that certain memory cells or memory cell areas are replaced by spare memory cells or spare memory cell areas.

However, testing, configuring and operating memory devices of this type are associated with great expenditure and, in addition, cannot be carried out faultlessly under all circumstances.

SUMMARY OF THE INVENTION

The object of the invention is to provide a memory device which overcomes the above-noted deficiencies and disadvantages of the prior art devices and methods of this kind, and which allows the memory device to be reliably tested, configured, and operated with minimum expenditure.

With the above and other objects in view there is provided, in accordance with the invention, a memory device, comprising:

a multiplicity of memory cells for storing data;

comparison units each having an address input and being configured to check whether an address applied to the memory device is associated with a memory cell which cannot be properly written to or read out or is located in a memory cell area containing memory cells which cannot be properly written to or read out; and wherein, during in a testing phase of the memory device, the comparison units are placed into a testing state different from a state during a normal operation of the memory device.

In accordance with an added feature of the invention, the comparison units are configured to compare the address applied to the memory device with reference addresses associated with the comparison units.

In accordance with an additional feature of the invention, each comparison unit has associated therewith an individual reference address.

In accordance with another feature of the invention, the comparison units operate in parallel and compare the address applied to the memory device simultaneously with all reference addresses.

In accordance with a further feature of the invention, the comparison units are each associated with a respective memory area of the memory device by the reference addresses, and they compare whether the address applied to the memory device is within the memory area respectively associated therewith.

In accordance with again an added feature of the invention, the addresses of the memory cells which cannot be properly written to or read out or of the memory cell areas containing memory cells which cannot be properly written to or read out are defined as reference addresses.

In accordance with again an additional feature of the invention, test addresses suitable for testing the memory device are defined as reference addresses. Advantageously, the test addresses are used during the testing of the memory device.

In accordance with again another feature of the invention, the test addresses are specified independently of the reference addresses with which the comparison units normally compare the addresses applied to the memory device.

In accordance with again a further feature of the invention, the reference addresses can be registered at least partially permanently in the memory device.

In accordance with yet an added feature of the invention, there are provided a plurality of fuses defining the registration of the addresses.

In accordance with yet an additional feature of the invention, only selected comparison units are activated during the testing phase of the memory device, and all other comparison units are deactivated.

In accordance with yet another feature of the invention, the comparison units can be selectively activated and deactivated, during the testing of the memory device, independently of whether the comparison units are activated or deactivated in normal operation of the memory device.

In accordance with yet a further feature of the invention, only such a number and such comparison units are activated that at a maximum one of the activated comparison units can find a correspondence for each address applied to the memory device.

In accordance with a concomitant feature of the invention, such a number and such comparison units are activated that the memory areas with which the activated comparison units are associated or can be associated by means of their reference address comprise all memory cells which can be addressed by the addresses applied to the memory device.

With the above and other objects in view there is also provided, in accordance with the invention, a method of operating the memory device as outlined above. The method comprises checking, with the comparison units, whether an address applied to the memory device is associated with a memory cell which cannot be properly written to or read out or is located in a memory cell area containing memory cells which cannot be properly written to or read out, and, during a testing of the memory device, placing the comparison units into a state which differs from a state of the comparison units during a normal operation of the memory device.

In other words, during the testing of the memory device, the comparison units can be placed into a state which differs from the state which the comparison units are in during the normal operation of the memory device.

This makes it possible to test the memory device with minimum expenditure to an extent which has hitherto not been possible. This extensive test has made it possible reliably to detect all faults, especially also those existing in the comparison units. This, in turn, makes it possible to configure the memory device in an optimum way and to operate it absolutely faultlessly.

Thus, the memory device can be reliably tested, configured and operated with minimum expenditure.

Other features which are considered as characteristic for the invention are set forth in the appended claims.

Although the invention is illustrated and described herein as embodied in a memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The memory device considered herein is a RAM chip, more precisely a DRAM chip. However, it will be understood that there is no restriction in this respect. The memory device can also be any other memory device for storing data.

Figure 5:
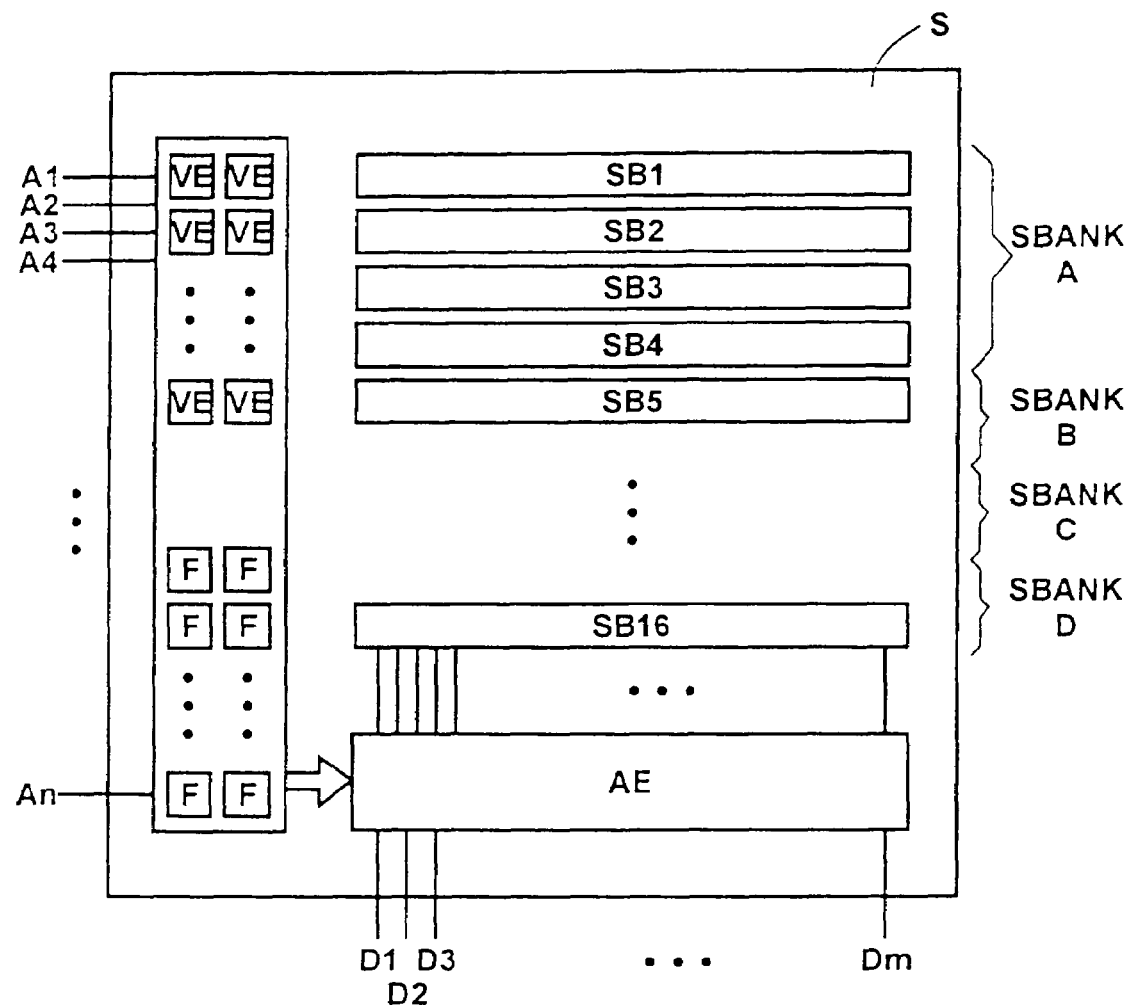
FIG. 5 is a schematic diagram showing the basic structure of a memory device of the type presently considered.

The memory device described in greater detail in the text which follows has the same basic structure as the memory device described in the introductory text above with reference to FIG. 5.

The memory device according to the invention also has more memory cells than are required for storing a volume of data corresponding to the useable memory capacity. The additional memory cells are useable as spare memory cells or spare memory cell areas for memory cells or memory cell areas which cannot be properly written to or read out.

The memory cells or memory cell areas which cannot be properly written to or read out are determined by a test of the memory cells. The addresses of these memory cells or memory cell areas are registered in the memory device by using fuses. In the exemplary embodiment these are fuses F that can be destroyed by a laser.

In normal operation of the memory device, the addresses applied to it are compared with the addresses of the memory cells or memory cell areas which cannot be properly written to or read out and are registered in the memory device by using the comparison units VE; the comparison units VE use the addresses of the memory cells or memory cell areas which cannot be properly written to or read out, as reference addresses with which they compare the addresses applied to the memory device.

If a comparison unit finds a correspondence of the addresses to be compared, it signals this to the selection device AE which thereupon ensures that data to be written to the memory device are not written to the memory cells which are associated with the address applied to the memory device but to (spare) memory cells associated with the memory cells which cannot be used or, respectively, that data to be read out of the memory device are not read out of the memory cells which are associated with the address applied to the memory device but out of (spare) memory cells associated with the memory cells which cannot be used.

In the exemplary embodiment, 16 comparison units are provided per memory block. These comparison units are distributed over comparison unit banks comprising four comparison units in each case. As will still be explained in greater detail later, the comparison unit banks are presently associated with a particular memory block in each case.

It will be understood that more or fewer comparison units can also be provided and that the comparison units can also be distributed over comparison unit banks comprising more or fewer comparison units or not over comparison unit banks at all.

Each comparison unit is associated with its own reference address.

The existing comparison units operate in parallel so that the addresses applied to the memory device are in each case compared simultaneously by all comparison units with the reference addresses associated with these, that is to say simultaneously with all reference addresses.

Figure 1:
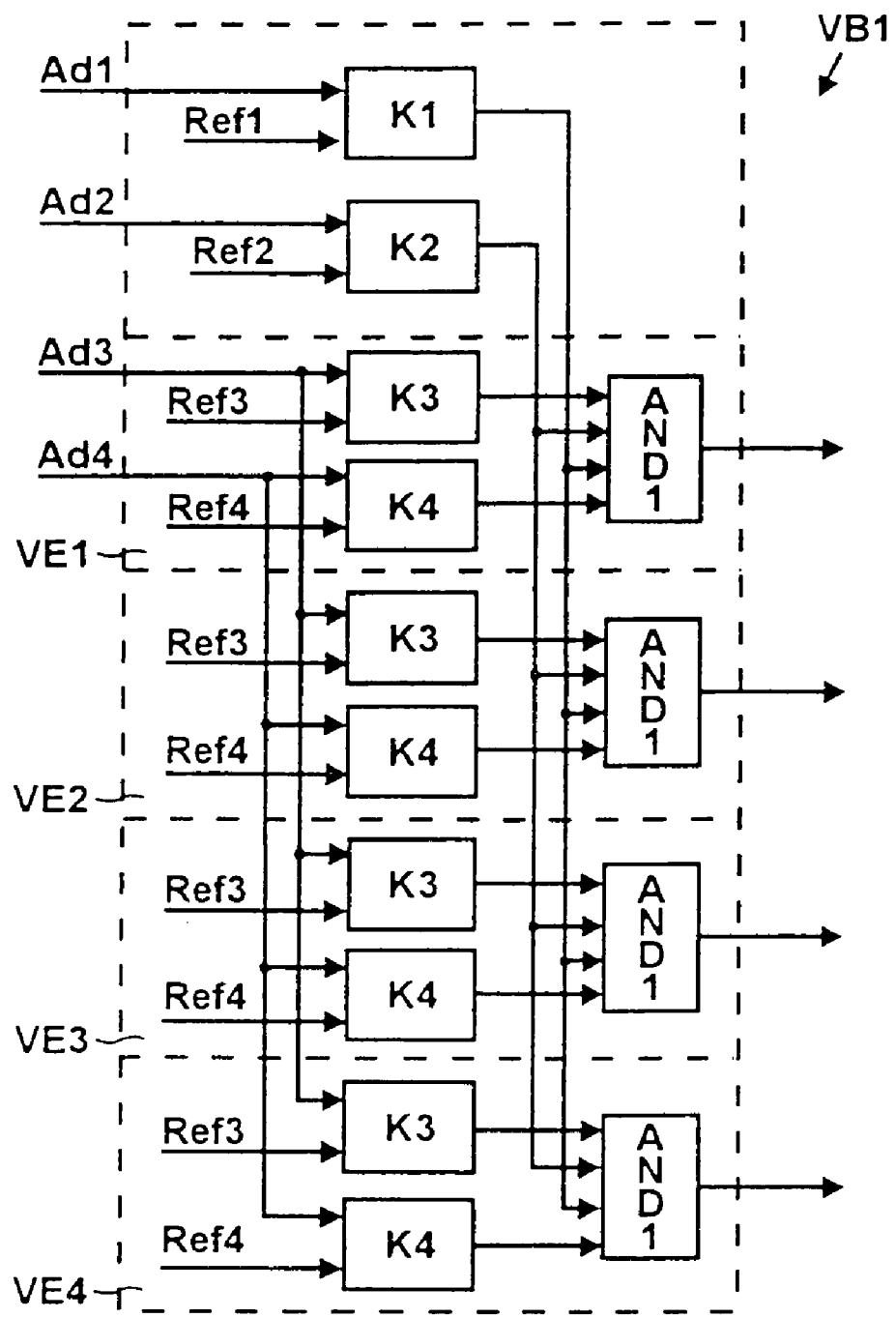
FIG. 1 is a diagrammatic view of the structure of comparison units, provided in the memory device described in greater detail in the text which follows, for comparing addresses supplied to the memory device with addresses of memory cells which cannot be properly written to or read out.

Referring now to the figures of the drawing in detail and first, particularly, to FIG. 1 thereof, there is seen a comparison unit bank consisting of four comparison units.

In this configuration, the comparison units are designated by the reference symbols VE1, VE2, VE3 and VE4 and the comparison unit bank containing these comparison units is designated by the reference symbol VB1.

Apart from the comparison units VE1 to VE4, the comparison unit bank VB1 contains two comparators K1 and K2, in which configuration:

the comparator K1 checks whether the memory bank which is addressed by the address supplied to the memory device is the memory bank in which the memory block is located with which the relevant comparison unit bank is associated (by means of the reference addresses associated with the comparison units contained therein); and the comparator K2 checks whether the memory block (within a memory bank) which is addressed by the address supplied to the memory device is the memory block with which the relevant comparison unit bank is associated (by means of the reference addresses associated with the comparison units contained therein).

The comparison units VE1 to VE4 have an identical structure. As will be understood even better below, although this is not mandatory and even causes greater expenditure in the production of the memory device, memory devices constructed in this manner can be designed, modified, and tested with minimum expenditure.

The comparison units VE1 to VE4 in each case contain comparators K3 and K4 and an AND gate AND1, in which configuration:

the comparators K3 in each case check whether the memory cell columns associated with the address supplied to the memory device are the memory cell columns or are located at least partially under the memory cell columns which are associated with the reference address associated with the relevant comparison unit;

the comparators K4 in each case check whether the memory cell row which is associated with the address supplied to the memory device is the memory cell row or is located under the memory cell rows which is or are associated with the reference address associated with the relevant comparison unit; and the AND gates AND1 subject the output signals of the local comparators K3 and K4 provided in the respective comparison units and the output signals of the global comparators K1 and K2 to an AND operation.

The output signals of the AND gates AND1 indicate whether the address applied to the memory device corresponds to the reference address associated with the relevant comparison unit. If a correspondence is found, this signals that an address applied to the memory device designates a memory cell which cannot be properly written to or read out or is located in a memory cell area containing memory cells which cannot be properly written to or read out.

The output signals of all AND gates AND1 of a respective comparison unit bank are supplied to a logic, not shown in the figures, and the output signal of this logic controls the aforementioned selection device AE which, if necessary, ensures that redundant, i.e., spare, memory cells associated with the memory cells which cannot be used are accessed; the selection device AE is caused to replace unusable memory cells or memory cell areas with spare memory cells or spare memory cell areas if one of the AND1 output signals indicates that the relevant comparison unit has found a correspondence between the address supplied to the memory device and the reference address associated with the comparison unit, and the selection device AE is not caused to perform memory cell or memory cell area replacements if no correspondence has been found between the addresses to be compared by the comparison units.

The comparators K1 to K4 receive Ad1 and Ref1 (comparator K1), Ad2 and Ref2 (comparator K2), Ad3 and Ref3 (comparator K3) and, respectively, Ad4 and Ref4 (comparator K4) as input signals, where Ad1 to Ad4 are parts of the address applied to the memory device or are extracted therefrom;

Ref1 to Ref3 are parts of the reference addresses associated with the comparison units or are extracted therefrom, and are set in the memory device by using fuses F in the example considered; and Ref4 is a part of the reference addresses associated with the comparison units or is extracted therefrom, and is permanently (unalterably) set in the memory device during the production of the memory device in the example considered.

The input signals Ad1 and Ref1 specify the memory bank to which the addresses relate in each case. They each comprise 2 bits in the example considered (because the memory device considered comprises or can comprise four memory banks).

The input signals Ad2 and Ref2 specify the memory block within the selected memory bank to which the addresses relate in each case and in each case also comprise 2 bits in the example considered (because the memory banks in each case comprise or can comprise 4 memory blocks in the exemplary embodiment).

The input signals Ad3 and Ref3 specify the memory cell columns associated with the addresses and in each case also comprise 2 bits in the example considered, more precisely the two most significant bits of the column addresses.

The input signals Ad4 and Ref4 specify the memory cell row(s) associated with the addresses and in each case also comprise 2 bits in the example considered, more precisely the two most significant bits of the row addresses.

In the example considered, input signals Ref4 are set in such a manner that, independently of the address supplied to the memory device, in each case precisely one comparator K4 of each comparison unit bank signals a correspondence, that is to say, for example, to 00 for VE1, to 01 for VE2, to 10 for VE3 and to 11 for VE4.

Due to the fact that in each case only the two most significant bits are taken into consideration in the comparisons of the column addresses and of the row addresses to be carried out, the comparisons "only" check whether the address applied to the memory device designates a memory cell which is within a memory cell area containing memory cells which cannot be properly written to or read out. Thus, in the example considered, it is not only individual memory cells which are replaced by spare memory cells but more or less large memory cell areas are replaced by spare memory celL areas.

During the testing of the memory device, the comparison units can be placed into a state which differs from the state which the comparison units are in during the normal operation of the memory device.

In particular, the differences consist in that during the testing of the memory device, independently of the conditions prevailing in normal operation of the memory device, selected comparison units are activated and all other comparison units are deactivated and/or during the testing of the memory device, the addresses applied to it can be compared with reference addresses which deviate from the reference addresses used in normal operation of the memory device.

The changes in the comparison units which are required for this are initiated by a control signal TEST supplied to the comparison units.

This control signal TEST controls, among other things, one or more activation/deactivation facilities for selectively activating or, respectively, deactivating the existing comparison facilities.

In the example considered, each comparison unit contains one activation/deactivation facility. If all comparison units of a comparison unit bank are to be treated uniformly, however, it can also be provided to provide a common activation/deactivation facility for all comparison units of a comparison unit bank.

Figure 2:
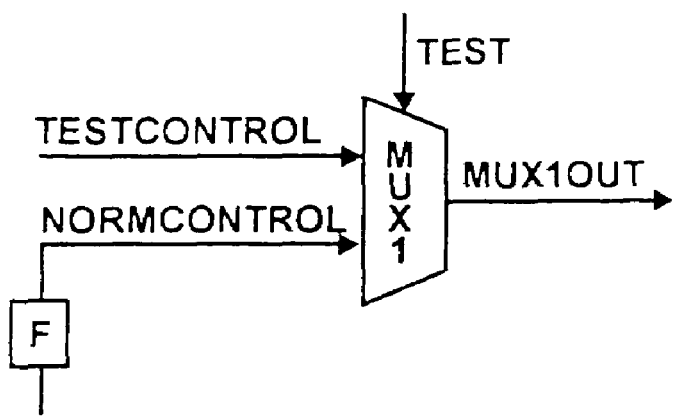
FIG. 2 is a diagram of the structure of an activation/deactivation facility with which the comparison units according to FIG. 1 can be selectively activated and deactivated.

Referring now to FIG. 2, there is shown one of the activation/deactivation facilities.

The activation/deactivation facility consists of a multiplexer MUX1, which, depending on the control signal TEST, switches through either an input signal TESTCONTROL or an input signal NORMCONTROL. The output signal MUX1OUT of the multiplexer MUX1 is supplied to the comparison units which can be activated or deactivated as a function of this signal, unless the activation/deactivation facility is already a component of the comparison units in any case.

In the exemplary embodiment, the activation/deactivation facility is configured in such a manner, that, in normal operation of the memory device—which would be the case if TEST=0—the multiplexer MUX1 switches through the signal NORMCONTROL and in test operation of the memory device—which would be the case if TEST=1—switches through the signal TESTCONTROL.

Both the signal TESTCONTROL and the signal NORMCONTROL can optionally assume the level 0 or 1.

In the exemplary embodiment, the line carrying the signal TESTCONTROL is permanently connected to a potential representing a low level or to a potential representing a high level in the production of the memory device. However, it can also be provided that the TESTCONTROL level can be set statically or dynamically.

The line carrying the signal NORMCONTROL is connected via a fuse F to a potential:

which, if it is switched through to MUX1OUT (in the case of TEST=0 and an undestroyed fuse F), has the effect in the comparison units operating as a function F (of this signal that the relevant comparison units are deactivated; and the lack of which (in the case of TEST=0 and a destroyed fuse F) has the effect in the comparison units operating as a function of the output signal MUX1OUT of the multiplexer MUX1 that the relevant comparison units are activated.

Figure 3:
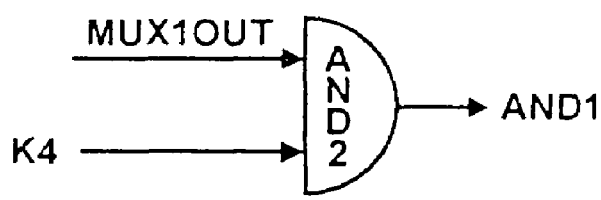
FIG. 3 is a diagram showing the use of the output signal of the activation/deactivation facility according to FIG. 2 for activating and deactivating the comparison units.

In the exemplary embodiment, the signal MUX1OUT of the multiplexer MUX1 is inverted and then subjected to a logic operation (for example an AND operation performed by an AND gate AND2) with the respective output signal of the comparator K4 of the comparison units operating as a function of MUX1OUT. The result of this logic operation is supplied to the AND gate AND1 instead of the output signal of the comparator K4. This logic combination is shown in FIG. 3.

When and as long as the signal switched through by the multiplexer MUX1 has the level 1, the level of the output signal of the AND gate AND2, and thus also the level of the AND gate AND1, always have the value 0 independently of the level of the output signal of the comparator K4, as a result of which the relevant comparison unit is not able to signal correspondences of the address applied to the memory device with the reference address associated with the comparison unit.

When and as long as the signal switched through by the multiplexer MUX1 has the level 0, which is the case when the fuse F is destroyed, the level of the output signal of the AND gate AND2 is in correspondence to the level of the output signal of comparator K4, as a result of which the relevant comparison unit can signal correspondences of the address applied to the memory device with the reference address associated with the comparison unit.

In this manner, the comparison units can be selectively activated and deactivated both in test operation and in normal operation of the memory device. The activation and deactivation of the comparison units in test operation can take place independently of whether and possibly which comparison units are activated or deactivated in normal operation of the memory device; this is because whether and possibly which comparison units are activated or deactivated depends on the signal TESTCONTROL in test operation (TEST=1) and on the signal NORMCONTROL in normal operation (TEST=0), and these signals can be specified independently of one another for each comparison unit or for comparison unit groups comprising a number of comparison units (e.g. comparison unit banks).

The memory device is structured in such a manner that its comparison units are not activated in normal operation of the memory device after the memory device has been produced (fuse F of the activation/deactivation facility not yet destroyed). In normal operation, the comparison units are preferably only taken into operation when it is found during a test of the memory device that not all memory cells can be properly written to or read out. The taking into operation of the comparison units can be carried out by destroying the fuse F of the activation/deactivation facility associated with the relevant comparison unit.

During testing of the memory device, the comparison units can be arbitrarily activated and deactivated independently of one another; the level of the signals TESTCONTROL of the individual activation/deactivation facilities can be arbitrarily set and/or changed independently of one another.

In the exemplary embodiment, this is utilized to the effect that, especially when testing those components of the memory device the use of which allows memory cells or memory cell areas which cannot be properly written to or read out to be replaced by spare memory cells or spare memory cell areas, only very few selected comparison units are activated and tested.

Preferably, only such a number and such comparison units are activated that on the one hand, for each address applied to the memory device, a maximum one of the activated comparison units can find a correspondence, and/or on the other hand, the memory areas to which the activated comparison units are associated or can be associated by means of their reference address comprise all memory cells which can be addressed by the addresses applied to the memory device.

In the example considered, this is achieved by the fact that for each memory block, in each case only the comparison units of precisely one of the comparison unit banks associated with the relevant memory block is activated. That is to say of the in each case four comparison unit banks associated with each memory block, precisely one comparison unit bank is selected and in each case all comparison units of this one comparison unit bank per memory block are activated.

This is said to be advantageous because it prevents a number of comparison units being able to signal a correspondence of the address supplied to the memory device with the reference addresses associated with the comparison units and because this allows the expenditure required for the testing to be kept at a minimum.

The fact that during testing, especially of those components of the memory device the use of which allows memory cells or memory cell areas which cannot be properly written to or read out to be replaced by spare memory cells or spare memory cell areas, only a few selected comparison units are activated and tested does not mean that the test is incomplete. The probability of the existing comparison units already being partly faulty and partly faultless is negligibly low. If faults occur in integrated circuits such as the memory device presently considered, these extend over a relatively large area, as a rule, or to all circuit parts having an identical structure so that the faultlessness of individual comparison units makes it possible to assume that the (deactivated) comparison units which have not been tested are also faultless.

The aforementioned control signal TEST is used not only for controlling the activation/deactivation facility. It is also used for determining whether the activated comparison units compare the address applied to the memory device with the addresses of the memory cells or memory cell areas which cannot be properly written to or read out or with a test address suitable or needed for testing the memory device (whether the addresses of the memory cells or memory cell areas which cannot be properly written to or read out or test addresses are used as reference address).

Figure 4:
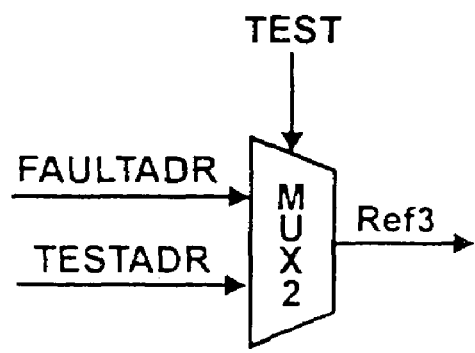
FIG. 4 is a diagram of a reference address selection device by means of which it is possible to determine with which one of a number of possible addresses the comparison facilities are to compare the address applied to the memory device.

For this purpose, it is provided in the exemplary embodiment that, during the testing of the memory device, the input signal Ref3 of the comparator K3 originates from a different signal source than in the normal operation of the memory device. In the example considered, a multiplexer MUX2 controlled by the control signal TEST is provided for this purpose. At the input terminals of this multiplexer, the associated bits of the addresses FAULTADR (registered by using fuses F in the memory device) of the memory cells or memory cell areas which cannot be properly written to or read out and the associated bits of the test address TESTADR are present. Such an arrangement is illustrated in FIG. 4.

The line carrying the test address TESTADR is permanently connected to a potential representing a low level or to a potential representing a high level. However, it can also be provided that the test address TESTADR can be set or changed statically or dynamically.

If TEST=0, that is to say in normal operation of the memory device, the multiplexer MUX2 switches through the FAULTADR bits present at this multiplexer, as a result of which the relevant comparison unit compares the address present at the memory device with one of the addresses of the memory cells or memory cell areas which cannot be properly written to or read out. If TEST=1, that is to say during testing of the memory device, the multiplexer MUX2 switches through the TESTADR bits present at this multiplexer, as a result of which the relevant comparison unit compares the address present at the memory device with the test address associated with the comparison unit.

A multiplexer MUX2 connected and operated as described is connected ahead of all comparators K3; naturally it can also be provided to connect such a multiplexer ahead of only selected comparators K3.

It should be clear that the reference addresses Ref1, Ref2 and/or Ref4 can also be generated or switched over in the manner described.

This makes it possible to compare addresses applied to the memory device with freely selectable test addresses in test operation of the memory device, where these test addresses can be specified completely independently of the addresses associated with the relevant comparison units in normal operation.

Naturally, during testing of the memory device, any other controls or settings of the comparison units or other components of the memory device can also be changed additionally or alternatively as described or differently.

A memory device structured as described can be reliably tested, configured and operated with minimum expenditure.

What is claimed is:

1. A memory device, comprising:
a multiplicity of memory cells for storing data;
comparison units connected to said memory cells and each having an address input for receiving at least a portion of an address applied to the memory device, said comparison units being configured to simultaneously check whether the address applied to the memory device is associated with at least one memory cell which cannot be properly written to or read out or to simultaneously check whether the address applied to the memory device is located in a memory cell area containing memory cells which cannot be properly written to or read out; and
in a testing phase of the memory device, said comparison units being placed into a testing state different from a state during a normal operation of the memory device.

2. The memory device according to claim 1, wherein said comparison units are configured to compare the address applied to the memory device with reference addresses associated with said comparison units.

3. The memory device according to claim 2, wherein each said comparison unit has associated therewith an individual reference address.

4. The memory device according to claim 2, wherein said comparison units operate in parallel and compare the address applied to the memory device simultaneously with all reference addresses.

5. The memory device according to claim 2, wherein said comparison units are each associated with a respective memory area of the memory device by the reference addresses, and are configured to compare whether the address applied to the memory device is within the memory area respectively associated therewith.

6. The memory device according to claim 2, wherein the addresses of the memory cells which cannot be properly written to or read out or of the memory cell areas containing memory cells which cannot be properly written to or read out are defined as reference addresses.

7. The memory device according to claim 2, wherein test addresses suitable for testing the memory device are defined as reference addresses.

8. The memory device according to claim 7, wherein the test addresses are used during the testing of the memory device.

9. The memory device according to claim 8, wherein the test addresses are specified independently of the reference addresses with which the comparison units normally compare the addresses applied to the memory device.

10. The memory device according to claim 1, wherein reference addresses associated with at least one of the testing state and the normal state of said comparison units can be registered at least partially permanently in the memory device.

11. The memory device according to claim 10, which comprises a plurality of fuses defining the registration of the addresses.

12. The memory device according to claim 1, wherein, during the testing phase of the memory device, only selected comparison units are activated and all other comparison units are deactivated.

13. The memory device according to claim 12, wherein said comparison units are selectively activatable and deactivatable, during the testing of the memory device, independently of whether said comparison units are activated or deactivated in normal operation of the memory device.

14. The memory device according to claim 12, wherein only such a number and such comparison units are activated that at a maximum one of the activated comparison units can find a correspondence for each address applied to the memory device.

15. The memory device according to claim 12, wherein such a number and such comparison units are activated that the memory areas with which the activated comparison units are associated or can be associated by means of their reference address comprise all memory cells which can be addressed by the addresses applied to the memory device.

16. A method of operating a memory device, which comprises providing a memory device with a multiplicity of memory cells for storing data and a plurality of comparison units according to claim 1, checking, with the comparison units, whether an address applied to the memory device is associated with a memory cell which cannot be properly written to or read out or is located in a memory cell area containing memory cells which cannot be properly written to or read out, and, during a testing of the memory device, placing the comparison units into a state which differs from a state of the comparison units during a normal operation of the memory device.

17. The method according to claim 16, which comprises comparing with the comparison units the address applied to the memory device with reference addresses associated with the comparison units.

18. The method according to claim 17, which comprises operating the comparison units in parallel and comparing, with the comparison units, the address applied to the memory device simultaneously with all reference addresses.

19. The method according claim 17, which comprises associating each of the comparison units with a particular memory area of the memory device by the reference addresses and checking, with comparisons carried out by the comparison units, whether the address applied to the memory device is within the memory area with which the specific comparison unit are associated in each case.

20. The method according to claim 17, which comprises utilizing the addresses of the memory cells which cannot be properly written to or read out or of the memory cell areas containing memory cells which cannot be properly written to or read out as reference addresses.

21. The method according to claim 17, which comprises defining test addresses suitable for testing the memory device as reference addresses.

22. The method according to claim 21, which comprises utilizing the test addresses during the testing of the memory device.

23. The method according to claim 22, which comprises specifying the test addresses independently of the reference addresses with which the comparison units normally compare the addresses applied to the memory device.

24. The method according to claim 16, which comprises registering the reference addresses at least partially permanently in the memory device.

25. The method according to claim 16, which comprises, during the testing of the memory device, activating only selected comparison units and retaining all other comparison units deactivated.

26. The method according to claim 25, which activating only such a number and such comparison units that at a maximum one of the activated comparison units can find a correspondence for each address applied to the memory device.

27. The method according to claim 25, which comprises activating such a number and such comparison units that the memory areas with which the activated comparison units are associated or can be associated by means of their reference address comprise all memory cells which can be addressed by the addresses applied to the memory device.

* * * * *